United States Patent
Kim et al.

(10) Patent No.: US 10,931,294 B2
(45) Date of Patent: Feb. 23, 2021

(54) APPARATUS AND METHOD FOR MEASURING FREQUENCY OF SIGNAL

(71) Applicant: AGENCY FOR DEFENSE DEVELOPMENT, Daejeon (KR)

(72) Inventors: Sang Won Kim, Daejeon (KR); Dong Keun Lee, Daejeon (KR); Jeung Min Joo, Daejeon (KR); Jung Hoon Kim, Daejeon (KR); Sung Jin Jo, Daejeon (KR); Un Seob Jeong, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 0 days.

(21) Appl. No.: 16/925,908

(22) Filed: Jul. 10, 2020

(65) Prior Publication Data
US 2021/0013897 A1     Jan. 14, 2021

(30) Foreign Application Priority Data

Jul. 12, 2019 (KR) .................. 10-2019-0084562

(51) Int. Cl.
*H03M 1/20* (2006.01)
*H03M 1/10* (2006.01)
(Continued)

(52) U.S. Cl.
CPC ........ *H03M 1/1085* (2013.01); *G01R 23/145* (2013.01); *H03M 1/1245* (2013.01); *H03M 1/60* (2013.01)

(58) Field of Classification Search
CPC .... H03M 3/424; H03M 3/408; H03M 1/0673; H03M 1/1215; H03M 1/365; H03M 1/662; H03M 3/496; H03M 3/458; H03M 1/0624; H03M 1/0626; H03M 1/12; H03M 1/1205; H03M 3/402; H03M 3/42; H03M 3/468; H03M 13/27; H03M 1/0614; H03M 1/188; H04L 25/03343; H04L 5/0023;
(Continued)

(56) References Cited

U.S. PATENT DOCUMENTS 5,173,706 A * 12/1992 Urkowitz ................ G01S 7/032
342/101
5,293,114 A    3/1994 McCormick et al.
(Continued)

FOREIGN PATENT DOCUMENTS

JP     57-204464     12/1982

OTHER PUBLICATIONS

Office Action dated Jul. 24, 2020 for Korean Patent Application No. 10-2019-0084562 and its English machine translation by Google Translate.

*Primary Examiner* — Linh V Nguyen
(74) *Attorney, Agent, or Firm* — Ladas & Parry, LLP

(57) ABSTRACT

Provided are an apparatus and a method for measuring a frequency of a broadband signal by using low-speed ADCs having sub-Nyquist sampling rates. A plurality of channels each including a low-speed ADC having a sub-Nyquist sampling rate (e.g. sampling frequency from several MHz to hundreds of MHz) are provided, and the frequency of an input signal corresponding to a combination of frequencies calculated through the respective channels is estimated. Therefore, as the number of channels increases, the range of measurable frequencies may be extended.

10 Claims, 7 Drawing Sheets

(51) Int. Cl.
  *H03M 1/12* (2006.01)
  *H03M 1/60* (2006.01)
  *G01R 23/14* (2006.01)

(58) Field of Classification Search
  CPC .......... H04L 2025/03414; H04L 27/38; H04L 25/0204; H04L 25/0206; H04B 1/0007; H04B 1/001; H04B 1/40; H04B 7/0452; H04B 1/0475
  USPC .......................... 341/118, 120, 155, 139, 140
  See application file for complete search history.

(56) References Cited

U.S. PATENT DOCUMENTS

| | | | | |
|---|---|---|---|---|
| 5,406,949 A * | 4/1995 | Yao | ..................... | G01S 7/52028 600/447 |
| 7,692,574 B2 * | 4/2010 | Nakagawa | ............ | G01S 13/584 342/107 |
| 8,559,571 B2 * | 10/2013 | Tung | .................... | H04B 7/0617 375/346 |
| 8,836,552 B1 * | 9/2014 | Tietjen | ................ | H03M 1/1038 341/118 |
| 9,673,910 B1 * | 6/2017 | Crivelli | ............. | H04B 10/6162 |
| 9,689,967 B1 * | 6/2017 | Stark | ........................ | G01S 13/87 |
| 2001/0000216 A1 * | 4/2001 | Kober | ................... | H03M 1/121 341/155 |
| 2007/0071121 A1 * | 3/2007 | van Rooyen | ....... | H04L 25/0204 375/260 |
| 2008/0273636 A1 * | 11/2008 | Zhu | .................... | H04L 27/2647 375/345 |
| 2010/0120386 A1 * | 5/2010 | Konstantinos | ......... | H04B 1/001 455/180.1 |
| 2018/0083816 A1 * | 3/2018 | Bolstad | ............. | H01Q 21/0025 |

* cited by examiner

APPARATUS AND METHOD FOR MEASURING FREQUENCY OF SIGNAL

CROSS-REFERENCE TO RELATED APPLICATION

This application claims the benefit of Korean Patent Application No. 10-2019-0084562, filed on Jul. 12, 2019, in the Korean Intellectual Property Office, the disclosure of which is incorporated herein in its entirety by reference.

BACKGROUND

1. Field

One or more embodiments relate to an apparatus and a method for measuring the frequency of a signal, and more particularly, to an apparatus and a method for measuring the frequency of a broadband reception signal through a plurality of low-speed analog digital convertors (ADCs) instead of a high-speed ADC.

2. Description of Related Art

Apparatuses for measuring the frequency of signals are used in various fields. From among those fields, in a field like electronic warfare, in which the frequencies of short signals within μs (microseconds) are measured, a frequency measuring method like a Fourier transform (FFT) that requires many samples cannot be used, and thus an instantaneous frequency measurement (IFM)-based digital frequency discriminator (DFD) using delay lines and an analog phase comparing circuit is used. Also, in the case of electronic warfare, it is necessary to measure all the signals of a radar operating in the range from tens of MHz to tens of GHz, and thus, it is necessary to measure frequencies in a wide frequency range.

However, because most of such IFM-based DFDs are manufactured using analog circuits, they need to be individually tuned, and the unit price thereof is expensive. Therefore, an analog signal may be quantized by using a high-speed analog digital convertor (ADC) and the frequency of an input signal may be measured. However, because a broadband signal requires a quantization speed of at least twice the bandwidth of an input signal, in order to measure a broadband signal with a bandwidth of GHz or broader, a high-speed ADC having a quantizing speed of tens of giga sample per second (GSPS) is required.

Also, because signals of broader bands tend to be used due to the development of technology, it is difficult and expensive to obtain a high-speed ADC having a quantizing speed twice or higher than that of a broadband signal. Also, when signals of broader bands are used due to the development of technology, it is difficult to measure frequencies by using the high-speed ADC.

SUMMARY

One or more embodiments provide an apparatus and a method for measuring a frequency of a broadband signal by using multiple low-speed ADCs having sub-Nyquist sampling rates.

One or more embodiments provide an apparatus and a method for measuring a frequency of a broadband signal, the apparatus and the method capable of extending a measurable signal frequency band more inexpensively.

Additional aspects will be set forth in part in the description which follows and, in part, will be apparent from the description, or may be learned by practice of the presented embodiments of the disclosure.

According to one or more embodiments, a frequency measuring apparatus includes a coupler configured to generate an I component and a Q component from an input signal; a distributor configured to distribute the I component and the Q component to a plurality of channels; the plurality of channels each including an analog digital convertor (ADC), which is configured to sample an I component and a Q component input thereto and quantize a sampled I component and a sampled Q component, and a frequency measuring unit configured to calculate a frequency from a quantized I component and a quantized Q component; and a frequency estimator configured to estimate a signal frequency corresponding to a combination of frequency values respectively calculated in the plurality of channels based on frequency combination information including different signal frequencies and a combination of frequency values respectively corresponding to the signal frequencies, wherein respective ADCs included in the plurality of channels have different sampling speeds for sampling the I component and the Q component.

The ADC may have a sub-Nyquist sampling rate (e.g. from several MHz to several hundred MHz).

The ADC further includes a sampler configured to sample an I component and a Q components input thereto at a sampling speed corresponding to that of the ADC.

The frequency measuring unit may generate trajectories corresponding to frequency values calculated in the plurality of channels according to a change of an input signal in a multi-dimensional space according to the number of the plurality of channels, and, when the trajectories overlap at least partially, change a sampling frequency of each channel to satisfy a pre-set minimum distance between the trajectories.

The pre-set minimum distance may be calculated according to Equation 5 below when the number of the plurality of channels is 2.

$$\text{DISTANCE BETWEEN TRAJECTORIES} = \frac{|f_{s1} - f_{s2}|}{\sqrt{2}} \quad \text{[Equation 5]}$$

where $f_{s1}$ represents a sampling frequency of a first channel, and $f_{s2}$ denotes a sampling frequency of a second channel.

The frequency measuring unit may include a delay correlator configured to perform a correlation operation with values obtained by 1-clock delaying a quantized I component and a quantized Q component; a cumulator configured to accumulate I component values and Q component values correlated by the delay correlator on an I and Q coordinate plane; and a frequency calculator configured to calculate average values for each of accumulated I component values and accumulated Q component values that are accumulated on the I and Q coordinate plane, calculate a phase change range based on calculated average values of the accumulated I component values and the accumulated Q component values, and calculate a frequency value corresponding to a calculated phase change rate.

The frequency measuring unit may include a memory having data corresponding to combinations of the frequency values as address values and having specific signal frequencies as data corresponding to the address values.

According to one or more embodiments, a frequency measuring method includes a first step for generating an I component and a Q component from an input signal; a second step for distributing the I component and the Q component to a plurality of channels; a third step for sampling the I component and the Q component in each channel; a fourth step for quantizing a sampled I component and a sampled Q component in each channel; a fifth step for calculating a frequency value based on a quantized I component and a quantized Q component in each channel; a sixth step for generating a combination of frequency values calculated in respective channels; and a seventh step for estimating a signal frequency corresponding to generated combinations of frequency values based on frequency combination information including different signal frequencies and a combination of frequency values respectively corresponding to the signal frequencies, wherein the third step is a step for sampling the I component and the Q component input to the respective channels at different sampling speeds from one channel to another.

The different sampling speeds may be speeds from a several mega sampling per second (MSPS) to hundreds of MSPS.

The seventh step may further include a step 7-1 for generating trajectories corresponding to frequency values calculated in the plurality of channels according to a change of an input signal in a multi-dimensional space according to the number of the plurality of channels; and a step 7-2 for, when the trajectories overlap at least partially, changing a sampling frequency of each channel to satisfy a pre-set minimum distance between the trajectories.

The pre-set minimum distance may be calculated according to Equation 5 below when the number of the plurality of channels is 2.

$$\text{DISTANCE BETWEEN TRAJECTORIES} = \frac{|f_{s1} - f_{s2}|}{\sqrt{2}} \quad \text{[Equation 5]}$$

where $f_{s1}$ represents a sampling frequency of a first channel, and $f_{s2}$ denotes a sampling frequency of a second channel.

The fifth step may be a step for calculating a frequency value according to Equation 4 below.

$$f_{avg_m}(n) = \frac{\Delta\phi_{avg_m}(n)}{2\pi\Delta t} = \frac{1}{2\pi t_s}\text{atan}\left(\frac{Q'_{avg_m}(n)}{I'_{avg_m}(n)}\right) \quad \text{[Equation 4]}$$
$$= \frac{1}{2\pi t_s}\text{atan}\left(\frac{\sum_{k=n-m+1}^{n} Q'(k)}{\sum_{k=n-m+1}^{n} I'(k)}\right)$$

where $f_{avg_m}(n)$, denotes a frequency value measured with the last m samples, $\Delta\phi_{avg_m}(n)$ denotes an average phase angle change rate of the last m samples, $\Delta t$ denotes a time for the last m samples, $t_s$ denotes 1/sampling frequency ($f_s$), $Q'_{avg_m}(n)$ denotes an average of Q component correlation values $Q'$ of the last m samples, $I'_{avg_m}(n)$ denotes an average of I component correlation values $I'$ of the last m samples, and m denotes the number of samples used for averaging.

The Q component correlation value Q' and the I component correlation value I' may be values calculated by correlation-calculating an I component and a Q component, which are obtained by quantizing a sampled I component and a sampled Q component for each channel, according to Equation 3 below.

$$I'(n)=(\cos(\phi(n))\cos(\phi(n-1))+\sin(\phi(n))\sin(\phi(n-1)))$$

$$Q'(n)=(\sin(\phi(n))\cos(\phi(n-1))-\cos(\phi(n))\sin(\phi(n-1))) \quad \text{[Equation 3]}$$

where Q' denotes the Q component correlation value, I' denotes the I component correlation value, and φ is a signal phase in radians.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
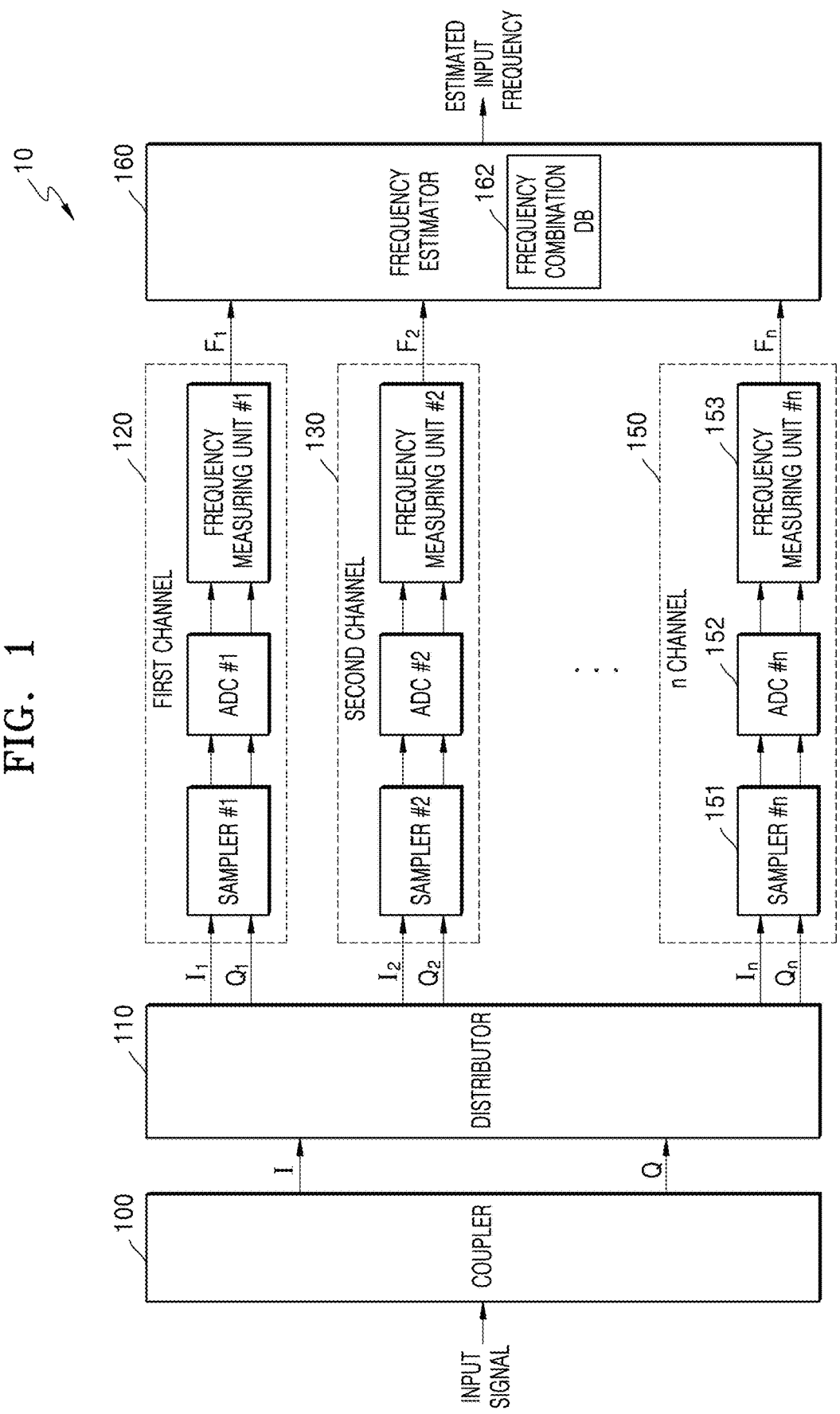
FIG. 1 is a block diagram showing the structure of a frequency measuring apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The terms used in the present specification are merely used to describe particular embodiments, and are not intended to limit the disclosure. As used herein, the singular forms "a," "an" and "the" are intended to include the plural forms as well, unless the context clearly indicates otherwise. The suffixes 'module' and 'unit' may be used for elements in order to facilitate the disclosure. Significant meanings or roles may not be given to the suffixes themselves and it is understood that the 'module' and 'unit' may be used together or interchangeably.

In this specification, expressions like "consists of" or "includes" should not be construed as including all the various components or multiple steps described in the specification. It should be interpreted that some of the components or some steps may not be included or additional components or steps may be included.

In the following description of one or more embodiments, the detailed description of known functions and configurations incorporated herein is omitted when it may make the subject matter of one or more embodiments rather unclear.

In addition, the accompanying drawings are only for facilitating understanding of embodiments disclosed in the present specification, and the technical spirit disclosed in the specification is not limited by the accompanying drawings, and it should be understood to include all modifications, equivalents, or substitutes included in the spirit and technical scope of one or more embodiments. In addition, not only each of the embodiments described below, but also combinations of the embodiments are modifications, equivalents, and substitutes included in the spirit and scope of one or more embodiments and may be within the scope and spirit of one or more embodiments.

In one or more embodiments, because a method requiring many samples, such as an FFT, may not be applied when measuring a signal frequency in a short period, the frequency of a signal is measured using the phase change rate of the signal. To this end, one or more embodiments may generate an I component and a Q component from an input signal, and distribute the I component and the Q component to a plurality of channels each including a sampler, a low-speed analog digital convertor (ADC), and a frequency measuring unit.

Samplers of the plurality of channels may have different sampling speeds (sampling per second) from one another, and thus, the frequency ambiguity of the plurality of channels may have different characteristics. Therefore, even in the case of the same frequency, frequencies measured in respective channels may differ depending on frequency ambiguity characteristics of the respective channels. In this case, a combination of frequencies calculated in the respective channels having different frequency ambiguity characteristics may be a unique characteristic for a specific frequency.

Therefore, one or more embodiments provide a database including combinations of frequencies corresponding to respective broadband frequencies of input signals, and a frequency corresponding to a combination of frequencies calculated for respective channels can be estimated from the provided database, thereby enabling estimation of the frequency of an input signal.

FIG. 1 is a block diagram showing the structure of a frequency measuring apparatus 10 according to an embodiment. FIG. 2 is a diagram showing examples of input signal frequencies measured in channels having different sampling speeds in a frequency measuring apparatus according to an embodiment.

First, referring to FIG. 1, the frequency measuring apparatus 10 according to an embodiment includes a coupler 100, a distributor 110, a plurality of channels each including a sampler 151, an analog digital convertor (ADC) 152, and a frequency measuring unit 153, and a frequency estimator 160. The components shown in FIG. 1 are not indispensable for implementing the frequency measuring apparatus 10, and thus frequency measuring apparatus 10 described herein may have more or fewer components than those stated above.

First, the coupler 100 may separate an I component and a Q component of an input signal. Here, the coupler 100 is a quadrature coupler that generates two equal output signals and may generate a reference signal (I component) and a signal having a 90° phase difference (Q component) from an input broadband signal (input signal).

The distributor 110 may receive the I component and the Q component from the coupler 100 and distribute them to the plurality of channels, respectively. In this case, the I component and the Q component generated by the coupler 100 may be input to each channel through the distributor 110.

Moreover, the plurality of channels may each include the sampler 151, the ADC 152, and the frequency measuring unit 153. Here, the sampler 151 is for performing sampling and may include a track & hold IC having a sub-Nyquist sampling rate (e.g. sampling speed from several MSPS to hundreds of MSPS).

In this case, the track & hold IC, that is, the sampler 151, may perform sampling and input sampled signals to the ADC 152 connected thereto. This is because it is difficult to perform sampling of the broadband signal due to the quantizing speed (sampling frequency) of the ADC 152 being significantly lower than the input frequency of the broadband signal, the track & hold IC, that is, the sampler 151, performs high-speed sampling instead of the ADC 152, and the full power bandwidth of the ADC 152 may be extended through the sampler 151.

Also, the ADC 152 may quantize sampled I and Q components input from the sampler 151. Here, the ADC 152 has a sampling frequency from several MHz to several hundred MHz, compared to a high-speed ADC having a sampling frequency from several GHz to several tens of GHz and may be an ADC that is more inexpensive than the high-speed ADC. In the descriptions below, to distinguish from the high-speed ADC, the ADC 152 will be referred to as a low-speed ADC 152.

Moreover, I and Q components of each sample quantized through the low-speed ADC 152 may be input to the frequency measuring unit 153 connected to the low-speed ADC 152. Next, the frequency measuring unit 153 may measure the frequency of the input signal based on quantized I and Q components. To this end, the frequency measuring unit 153 may measure a phase change of the input signal based on the quantized I and Q components of each sample and may calculate the input frequency of the input signal based on the measured phase change. Hereinafter, the configuration of the frequency measuring unit 153 will be described below in more detail with reference to FIG. 3.

Moreover, as described above, according to one or more embodiments, an I component and a Q component may be input to each channel through the distributor 110, and each channel may include a sampler, a low-speed ADC, and a frequency measuring unit. Therefore, when the I component and the Q component are distributed to each channel through the distributor 110, frequencies corresponding to an input signal may be measured for respective channels.

However, because a sampled value includes I and Q components, the frequency range ($-f_s/2 \sim +f_s/2$) less than or equal to an half of a sampling frequency ($f_s$) of the low-speed ADC 152 may be measured without frequency ambiguity. However, when a signal with a frequency outside the frequency range is input, frequency distortion occurring due to sampling ambiguity of the signal is measured, and thus it is impossible to infer the frequency of an original signal from the measured value.

Here, the sampling ambiguity may refer to a frequency hopping that a frequency value measured at the moment when a frequency exceeds a maximum measurable frequency range is measured as a minimum measurable frequency again. For example, in the case where the sampling frequency ($f_s$) of the low-speed ADC 152 is 100 MHz, when the frequency of an input signal is between $-f_{s1}/2$ (−50 MHz) and $f_{s1}/2$ (50 MHz), sampling ambiguity may not occur. However, when a measured frequency value exceeds $f_{s1}/2$ (50 MHz) (e.g. 51 MHz), the frequency may hop to $-f_{s1}/2$ (−50 MHz) and may be measured again from a minimum measurable frequency $-f_{s1}/2$ (−50 MHz) as much as the frequency exceeding a maximum measurable frequency (may be measured as −49 Mhz).

On the other hand, such sampling ambiguity may occur differently depending on the sampling frequency. In other words, as described above, when the sampling frequency is 100 MHz, sampling ambiguity may occur when a frequency exceeds the range between $-f_{s1}/2$ (−50 MHz) and $f_{s1}/2$ (50 MHz). On the other hand, when the sampling frequency is 95 MHz ($f_{s2}$), sampling ambiguity may occur when a frequency exceeds the range between $-f_{s2}/2$ (−47.5 MHz) and $f_{s2}/2$ (47.5 MHz). Therefore, in a case where the frequency of an input signal is 51 Mhz, the frequency may be measured as −49 MHz when the sampling frequency is 100 MHz (hopping occurs at 50 MHz). However, when the sampling frequency is 95 MHz, the frequency may be measured as −44 MHz (hopping occurs at 47.5 MHz).

FIG. 2 is a diagram showing examples of input signal frequencies measured when sampling speeds are different as described above.

Figure 2A:
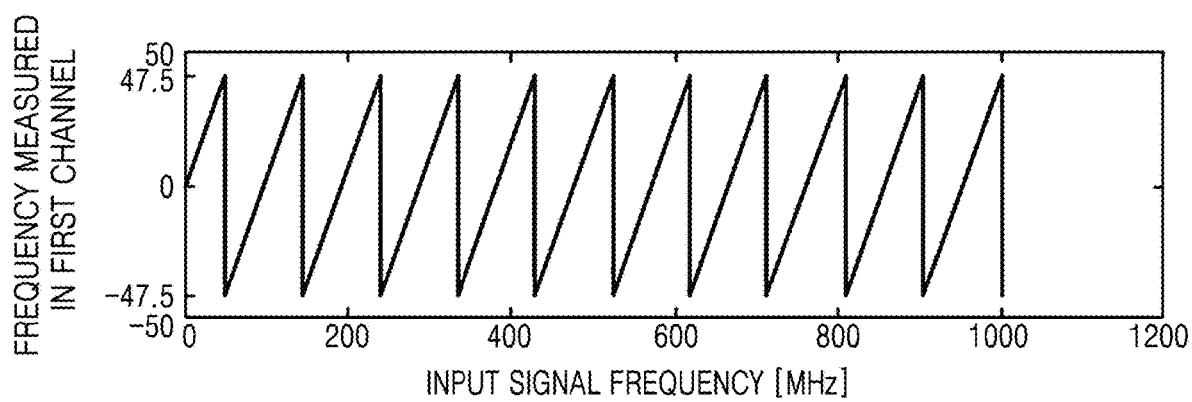
FIGS. 2A and 2B are diagrams showing examples of input signal frequencies measured in channels having different sampling speeds in a frequency measuring apparatus according to an embodiment.
Figure 2B:
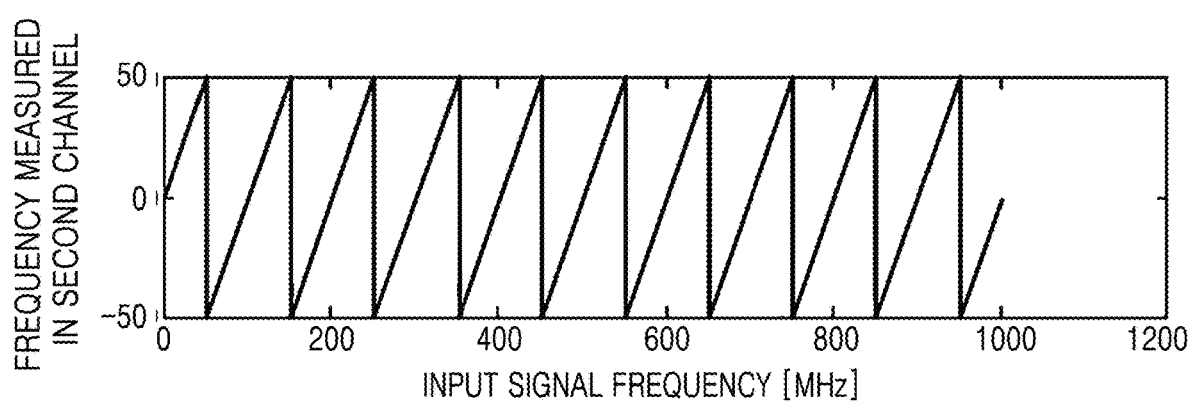

Referring to FIG. 2, FIGS. 2A and 2B show frequencies respectively measured for an input signal having a frequency range from 0 MHz to 1000 MHz for different sampling speeds.

First, FIG. 2A shows a case of 95 mega sample per second (MSPS; sampling frequency of 95 MHz). In this case, because the measurable frequency range is from −47.5 MHz to 47.5 MHz, a hopping may occur as shown in FIG. 2A in the case of an input signal frequency exceeding this range.

Moreover, FIG. 2B shows a case of 100 MSPS (sampling frequency of 100 MHz). In this case, because the measurable frequency range is from −50 MHz to 50 MHz, a hopping may occur as shown in FIG. 2B in the case of an input signal frequency exceeding this range.

Also, as shown in FIGS. 2A and 2B, when the sampling speeds (sampling frequencies) are different, different frequencies may be measured for the same input signal frequency. In other words, when the sampling speeds are different, sampling ambiguity characteristics differ from each other, and different frequencies may be measured according to a difference between the sampling speeds. Therefore, a combination of signal frequencies measured at different sampling speeds may be a unique characteristic for a particular frequency.

For example, when the frequency of an input signal is 51 MHz, a frequency measured by a frequency measuring unit in a channel performing sampling at the sampling speed of 95 MSPS (sampling frequency of 95 MHz) may be −44 Mhz. On the other hand, a frequency measured by the frequency measuring unit in a channel performing sampling at the sampling speed of 100 MSPS (sampling frequency of 100 MHz) may be −49 Mhz.

In this case, when the channel with the sampling speed of 95 MSPS is referred to as a first channel and the channel with the sampling speed of 100 MSPS is referred to as a second channel, a combination of the measurement result of the first channel and the measurement result of the second channel, i.e., (−49 MHz, −44 MHz), may be a unique characteristic for an input signal frequency 51 Mhz. Such a combination of frequencies may be used to estimate the frequency of an input signal.

To this end, samplers of the respective channels of the frequency measuring apparatus 10 according to one or more embodiments may have different sampling speeds. As such, when the samplers of the respective channels have different sampling speeds, different frequencies may be measured through the respective channels for the same input signal. Then, the frequency estimator 160 may generate a combination of different frequencies measured through the respective channels.

Also, the frequency estimator 160 may estimate an input signal frequency corresponding to the combination of frequencies measured through the respective channels from a pre-stored frequency combination database 162. For example, the frequency combination database 162 may include frequency combinations for different channels corresponding to different input signal frequencies. Here, different input signal frequencies may be classified according to a certain unit (e.g., 0.1 MHz).

In this case, the measurable frequency range of an input signal may be extended according to the number of channels. For example, when the number of channels is two (a first channel and a second channel), the frequency estimator 160 may estimate a frequency by combining two values. In this case, two measured frequency values may be coordinates on a 2-dimensional plane in which values of the first channel and the second channel are represented by respective axes, and the coordinates may be a point within the 2-dimensional plane.

For example, when the number of channels is three (a first channel, a second channel, and a third channel), the frequency estimator 160 may estimate a frequency by combining three values. In this case, three measured frequency values may be coordinates on a 3-dimensional plane in which values of the first channel, the second channel, and the third channel are represented by respective axes, and the coordinates may be a point within the 3-dimensional space. Also, in this case, because there may be a higher number of points than in the 2-dimensional plane, the measurable frequency range of an input signal may be greatly extended.

On the other hand, according to the above descriptions, the frequency measuring unit 153 of each channel may measure a frequency based on the value of the I component and the value of the Q component that are quantized by the low-speed ADC 152.

In general, in the measurement of a frequency according to the value of the quantized I component and the value of the quantized Q component, a signal phase in radians may be calculated as shown in Equation 1 below based on the value of the I component and the value of the Q component, and the frequency may be measured by calculating based on a rate of change of the signal phase calculated per unit time t.

$$\phi(\text{rad}) = \operatorname{atan}\left(\frac{Q_{value}}{I_{value}}\right) \quad \text{[Equation 1]}$$

$$freq(\text{Hz}) = \frac{\Delta\phi}{\Delta t}\frac{1}{2\pi} \qquad [\text{Equation 2}]$$

Here, $\Delta t$ is the amount of change of time, and $\Delta\phi$ is the amount of change of a signal phase.

Moreover, when a frequency is measured by using a phase change rate per unit time, to reduce a frequency measurement error due to the influence of noise, rates of changes for a plurality of number of unit times may be averaged for improved accuracy. Here, the number of samples needed for calculating an average value may be limited by the time that an input signal persists.

However, the phase of a signal is constantly changing, and, in the case of a fixed frequency signal, the phase of the signal may move by a regular interval per unit time. At this time, a phase change value needs to be calculated considering a boundary point between phase values π and −π, the point where phase ambiguity occurs.

In this case, when the sampling speed of the low speed ADC 152 is $f_s$ and the frequency of an input signal is measured by using a phase change rate per unit time, a phase change rate per unit sample of a signal having the signal frequency of $f_{s2}/2$ is located at a phase ambiguity occurrence boundary point (a border point between phase values in radians π and −π).

In this case, even with a slight noise component, the amount of phase change per unit sample occurs as π and −π and thus a measured frequency value may fluctuate between both extremes $f_s/2$ and $f_s/2$. Furthermore, when values are averaged for noise reduction, an average value may converge to 0, thereby causing a large error in frequency.

On the other hand, in most cases where an ADC is applied, an anti-aliasing filter is applied to prevent ambiguity in a result of the ADC, thereby limiting an input signal to a narrow bandwidth compared to a sampling rate $f_s$ of the ADC to prevent introduction of a signal nearby $f_s/2$ or $-f_s/2$.

However, in one or more embodiments, because signals of all frequencies may be introduced in a broadband range where the frequency range of input signals are much wider than $f_s$, it is necessary to be able to process a frequency of an input signal even when the frequency of the input signal corresponds to an odd multiple ($\pm f_s/2$, $\pm 3f_s/2$, $\pm 5f_s/2$) of $f_s/2$.

Therefore, in one or more embodiments, I and Q components corresponding to a phase difference between adjacent samples are obtained by using a 1-clock delay correlator rather than an average of phase difference values, and the I and Q components are plotted on a 2-dimensional I and Q coordinate plane to resolve the ambiguity occurring during phase angle conversion. Then, values of several I and Q samples are averaged on the I and Q coordinate plane, an average value thereof is converted to a phase angle, and a frequency is calculated for improved accuracy.

Figure 3:
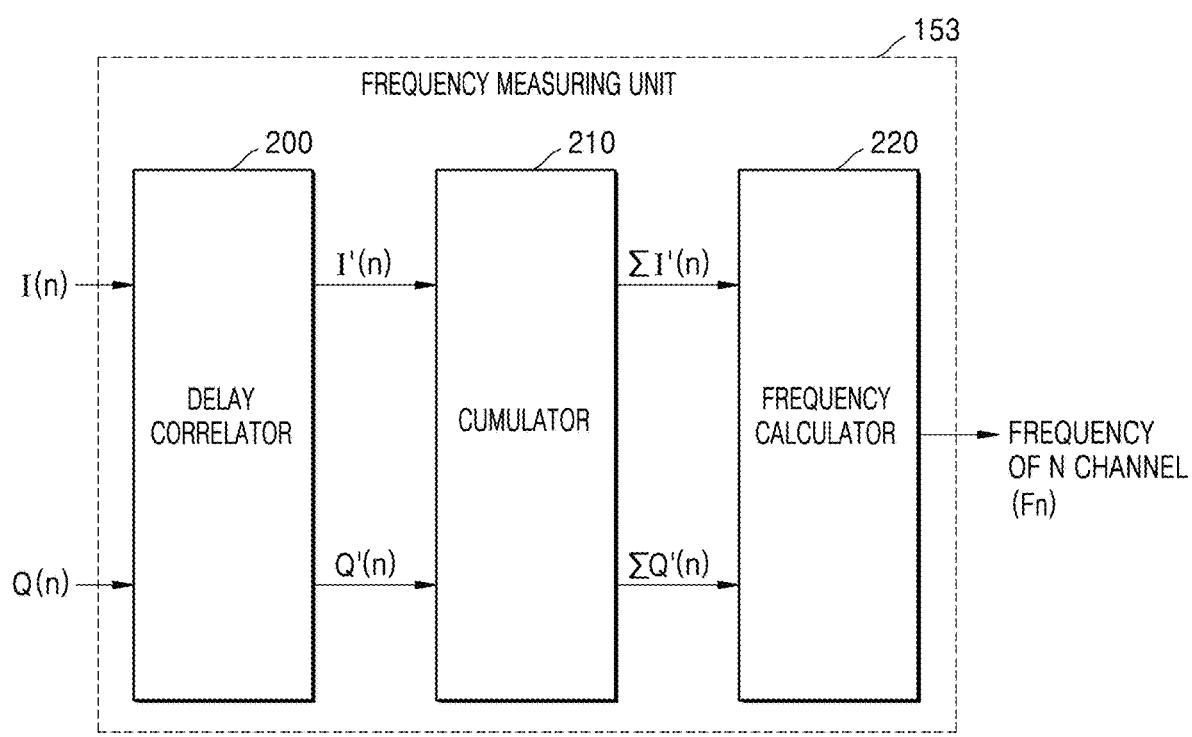
FIG. 3 is a block diagram showing the structure of a frequency measuring unit provided in each channel in a frequency measuring apparatus according to an embodiment.
Figure 4:
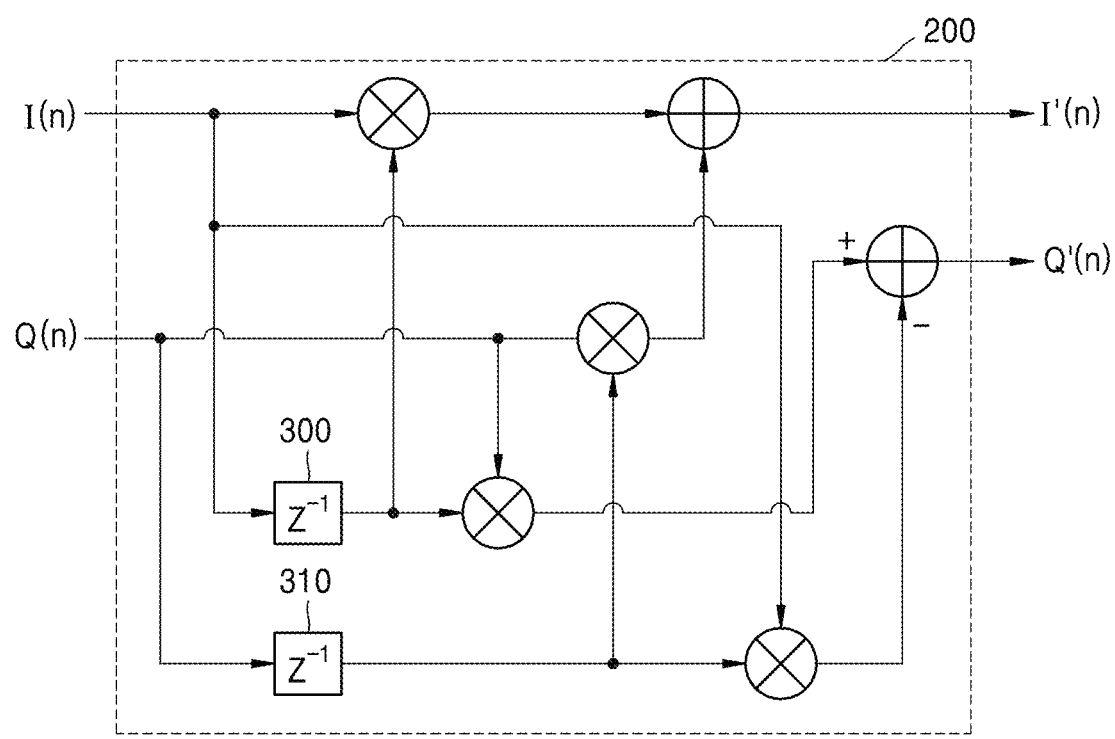
FIG. 4 is a block diagram showing the structure of a delay correlator provided in a frequency measuring unit according to an embodiment.

FIG. 3 is a block diagram showing the structure of a frequency measuring unit 153 provided in each channel in the frequency measuring apparatus 10 according to an embodiment. FIG. 4 is a block diagram showing the structure of a delay correlator 200 provided in the frequency measuring unit 153.

First, referring to FIG. 3, the frequency measuring unit 153 provided in each channel in the frequency measuring apparatus 10 according to an embodiment includes the delay correlator 200, a cumulator 210, and a frequency calculator 220.

First, the delay correlator 200 correlates an input I component value and an input Q component value with 1-clock delayed values and outputs an I component value I' and a Q component value Q' correlated with the 1-clock delayed values. Accordingly, the delay correlator 200 may be designed as shown in Equation 3 below.

$$\begin{aligned}
I'(n) &= (\cos(\phi(n))\cos(\phi(n-1)) + \\
&\quad \sin(\phi(n))\sin(\phi(n-1))) \\
Q'(n) &= (\sin(\phi(n))\cos(\phi(n-1)) - \\
&\quad \cos(\phi(n))\sin(\phi(n-1))) \\
\Delta\phi(n) &= \Delta\phi(n) - \Delta\phi(n-1) \\
&= \text{phase}(e^{j\phi(n)}/e^{j\phi(n-1)}) = \text{phase}(e^{j(\phi(n)-\phi(n-1))}) \\
&= \text{phase}((\cos(\phi(n)) + j\sin(\phi(n))) \times \\
&\quad (\cos(\phi(n-1)) - j\sin(\phi(n-1)))) \\
&= \text{phase}((\cos(\phi(n))\cos(\phi(n-1)) + \\
&\quad \sin(\phi(n))\sin(\phi(n-1))) + j(\sin(\phi(n))\cos(\phi(n-1)) - \\
&\quad \cos(\phi(n))\sin(\phi(n-1)))) \\
&= \text{phase}(I'(n) + jQ'(n)) = \text{atan}\left(\frac{Q'(n)}{I'(n)}\right)
\end{aligned} \qquad [\text{Equation 3}]$$

Therefore, the delay correlator 200 may be configured as shown in FIG. 4. In FIG. 4, a first delayer 300 is for 1-clock delaying an I component value, and a second delayer 310 is for 1-clock delaying a Q component value.

Moreover, values of the I component (I') and values of the Q component (Q') that are correlated with delayed values by the delay correlator 200 may be input to the cumulator 210. Then, the cumulator 210 may accumulate the I component correlation value I' and the Q component correlation value Q' on the I and Q coordinate plane and generate a cumulative value ΣI' of the I component correlation value I' and a cumulative value ΣQ' of the Q component correlation value Q'.

Moreover, the frequency calculator 220 may calculate a frequency based on the cumulative value ΣI' of the I component correlation value I' and the cumulative value ΣQ' of the Q component correlation value Q' calculated by the cumulator 210. To this end, the frequency calculator 220 may obtain average values of cumulative values ΣI' of the I component correlation values and cumulative values ΣQ' of the Q component correlation values and calculate a phase change rate based on obtained average values. Next, the frequency of the input signal may be calculated according to Equation 2 based on the calculated phase change rate.

In the cases of calculating a frequency in this way, coordinate samples (I', Q') of the I component correlation values I' and the Q component correlation values Q' scattered on the I and Q coordinate plane are accumulated at plane coordinates, and a frequency may be calculated by using a result thereof. Therefore, noise components may be removed through averaging. Also, because a phase value and a frequency are calculated through coordinate values on the I and Q coordinate plane from which noise is removed, it is possible to calculate a frequency value with a small error even at a low signal to noise ratio (SNR).

In the above description, the structure of the frequency measuring apparatus 10 according to one or more embodiments has been described in detail. Hereinafter, a process of measuring a frequency from an input signal according to one or more embodiments will be described in detail through flowcharts.

Figure 5:
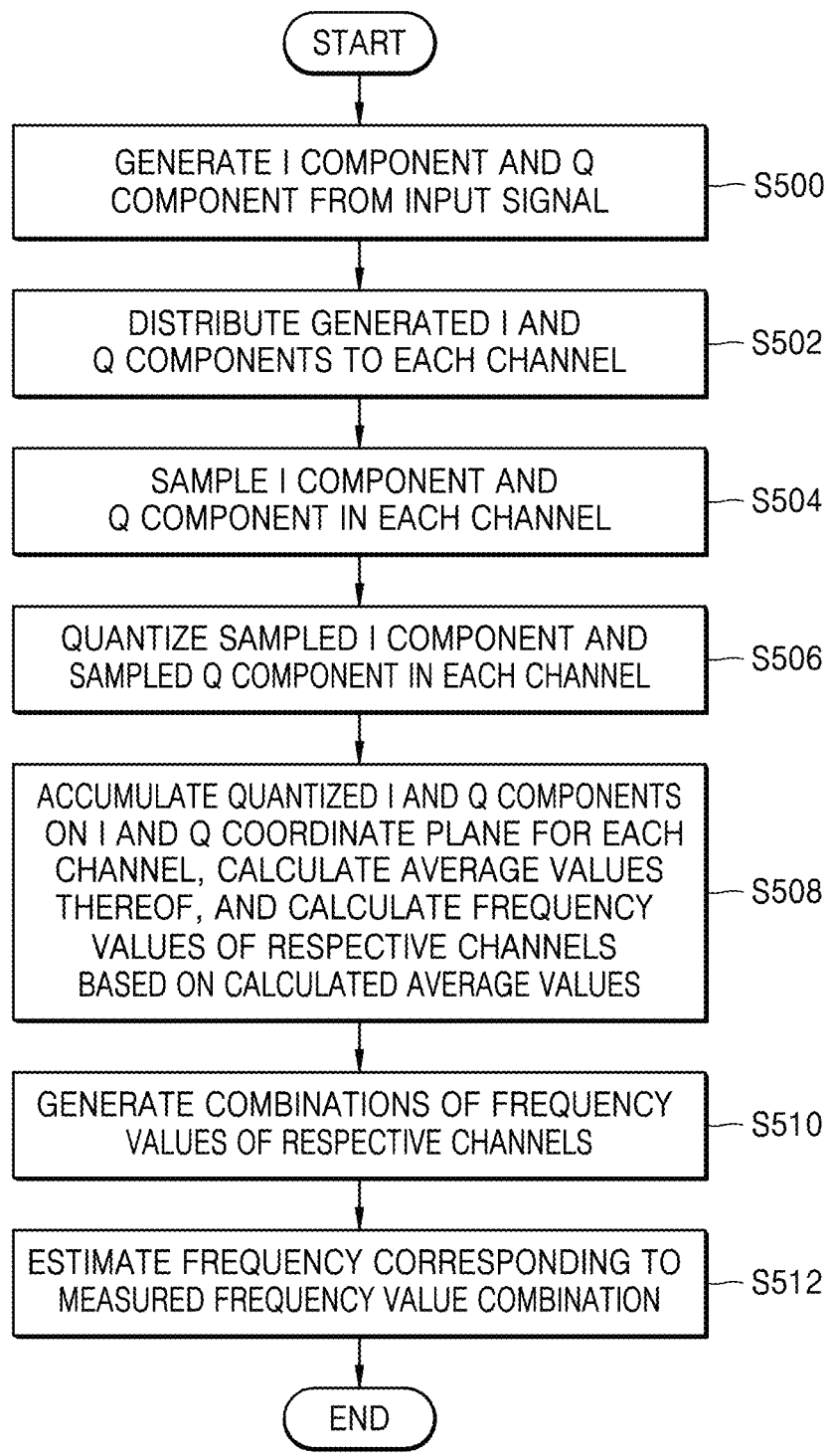
FIG. 5 is a flowchart showing an operation process in which the frequency of an input signal is measured by a frequency measuring apparatus according to the above-described embodiment.

FIG. 5 is a flowchart showing an operation process in which the frequency of an input signal is measured by the frequency measuring apparatus 10 according to the above-described embodiment.

Referring to FIG. 5, first, when a signal is input, the frequency measuring apparatus 10 according to one or more embodiments may generate an I component and a Q component from the signal (operation S500). Then, the I component and the Q component may be distributed to N channels (operation S502). Accordingly, the I component and the Q component generated from the input signal may be input to each of N channels.

Then, through a sampler provided in each channel, sampling of the I component and the Q component input to each channel may be performed (operation S504). In this case, samplers of different channels may perform sampling at different sampling speeds. Therefore, sampling ambiguity characteristics according to sampling frequencies may differ from one channel to another, and different frequency values may be measured for the same input signal.

Moreover, when sampling is performed through respective channels at different sampling speeds, a low speed ADC of each channel may quantize a sampled I component and a sampled Q component (operation S506). Then, a frequency measuring unit of each channel delay-correlates the I component and the Q component quantized by the low-speed ADC, calculates an I component correlation value I' and a Q component correlation value Q', and accumulates the I component correlation value I' and the Q component correlation value Q' on the I and Q coordinate plane.

Then, an average value of accumulated I component correlation values I' and an average value of accumulated Q component correlation values Q' may be calculated. Next, a phase change rate may be calculated based on calculated average values, and a frequency value may be calculated based on a calculated phase change rate (operation S508). Therefore, the frequency value may be calculated in operation S508 according to Equation 4 below.

$$f_{avg_m}(n) = \frac{\Delta\phi_{avg_m}(n)}{2\pi\Delta t} = \frac{1}{2\pi t_s}\mathrm{atan}\left(\frac{Q'_{avg_m}(n)}{I'_{avg_m}(n)}\right) \quad \text{[Equation 4]}$$

$$= \frac{1}{2\pi t_s}\mathrm{atan}\left(\frac{\sum_{k=n-m+1}^{n} Q'(k)}{\sum_{k=n-m+1}^{n} I'(k)}\right)$$

Here, $f_{avg_m}(n)$ denotes a frequency value measured with the last m samples, $\Delta\phi_{avg_m}(n)$ denotes an average phase angle change rate of the last m samples, $\Delta t$ denotes a time for the last m samples, $t_s$ denotes 1/sampling frequency ($f_s$), $Q'_{avg_m}(n)$ denotes an average of Q component correlation values Q' of the last m samples, $I'_{avg_m}(n)$ denotes an average of I component correlation values I' of the last m samples, and m denotes the number of samples used for averaging.

Moreover, in operation S508, frequency values may be calculated for respective channels according to Equation 4. Next, the frequency estimator 160 may generate a combination of frequency values calculated for the respective channels (operation S510). In this case, the frequency estimator 160 may combine frequency values calculated in a plurality of channels according to a preset order.

Next, the frequency estimator 160 may detect combination information corresponding to the combination of the frequency values measured in operation S510 from among pre-stored frequency combination information (operation S512).

Here, the frequency combination information may refer to combination information of frequency values corresponding to different input signal frequencies. Also, the different signal frequencies may be frequencies having a frequency difference from other adjacent signal frequencies. Also, the different signal frequencies may correspond to combinations of different frequency values. For example, when two channels are used, the frequency combination database 162 may include a combination of frequency values calculated respectively from the two channels and input signal frequencies corresponding thereto, as shown in Table below.

TABLE

| Input Signal Frequency | Frequency Value Combination | |
| --- | --- | --- |
| | First Channel Frequency Value ($f_{s1}$) | Second Channel Frequency Value ($f_{s2}$) |
| I1 | X1 | Y1 |
| I2 | X2 | Y2 |
| I3 | X3 | Y3 |
| I4 | X4 | Y4 |
| I5 | X5 | Y5 |
| ... | ... | ... |

Also, the frequency estimator 160 may output a signal frequency corresponding to measured frequency combination information as the frequency of the input signal input to the frequency measuring apparatus 10.

Figure 6:
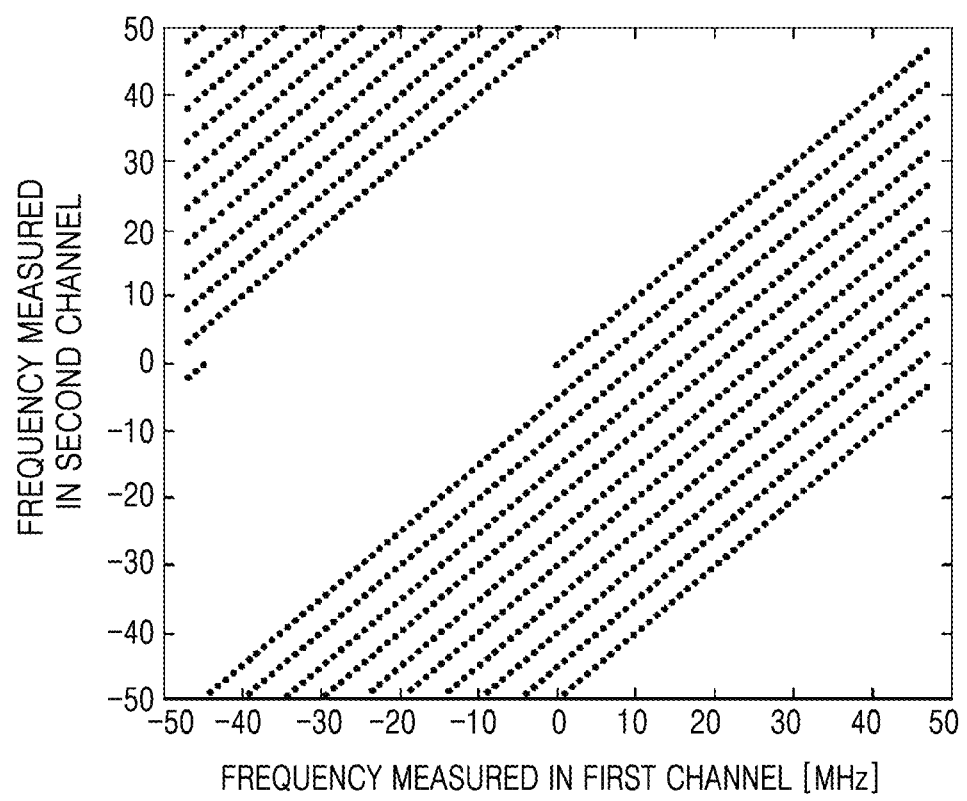
FIG. 6 is a diagram showing an example in which a combination of frequencies measured in channels having different sampling speeds can be estimated without any ambiguity by a frequency measuring apparatus according to one or more embodiments.

FIG. 6 is a diagram showing an example in which a combination of frequencies measured in channels having different sampling speeds can be estimated without any ambiguity by a frequency measuring apparatus according to one or more embodiments.

Referring to FIG. 6, when the sampling frequency ($f_{s1}$) of a first channel and the sampling frequency ($f_{s2}$) of a second channel are respectively set as 95 MHz and 100 MHz and the frequency of an input signal is changed by 1 MHz from 0 to 1000 MHz, frequencies ($f_{meas1}$ and $f_{meas2}$) measured in the respective channels are shown.

As shown in FIG. 6, as the frequency value of the input signal increases, the frequency value measured in each channel increases linearly and moves while forming a trajectory. After that, a measured frequency value of the second channel hops again to $-f_{s2}/2$ (−50 MHz) at a frequency exceeding $f_{s2}/2$ (50 MHz). When different values are set for $f_{s1}$ and $f_{s2}$ and only when change trajectories of measured frequency pairs do not overlap throughout the entire frequency range of the input signal, the input frequency may be calculated from a measurement result.

On the other hand, to determine the frequency of the input signal by using a combination of frequencies ($f_{meas1}$ and $f_{meas2}$) of a signal measured at different sampling speeds, an input signal frequency may be finalized from a combination of measured frequencies only when the same combination of measured frequencies are generated for all input signal frequencies.

Ideally, when $f_{s1}$ and $f_{s2}$ are slightly different, the frequency of an input signal may be inferred. However, in a real environment, the frequency of an input signal may be estimated to be a completely different frequency due to noise introduced together with the signal and frequency measurement errors that may occur from calculation errors. Therefore, sampling speeds may be set at a certain interval considering the above-stated factors.

Referring to FIG. 6, as the frequency value of the input signal increases, the frequency value measured in each channel increases linearly and moves while forming a trajectory. In this case, when different values are set for $f_{s1}$ and $f_{s2}$ and only when change trajectories of measured frequency pairs do not overlap throughout the entire frequency range of the input signal, the input frequency may be calculated from a measurement result.

In other words, the frequency estimator 160 may determine whether ambiguity occurs depending on whether the change trajectory lines of the measurement frequency pairs overlap. In addition, when the change trajectory lines of the measurement frequency pairs overlap, the frequency estimator 160 may adjust a distance between the change trajectory lines, such that the distance between the change trajectory lines satisfies a predetermined minimum value.

In this case, the adjustment of the distance between the change trajectory lines may be determined according to a difference between the sampling frequencies of the respective channels. For example, when the frequency measuring apparatus 10 uses two channels, the distance between the change trajectory lines may be determined according to a difference between the sampling frequency ($f_{s1}$) of the first channel and the sampling frequency ($f_{s2}$) of the second channel. In this case, the distance between the change trajectory lines may be calculated according to Equation 5 below, and the frequency estimator 160 may change the sampling frequency ($f_{s1}$) of the first channel and the sampling frequency ($f_{s2}$) of the second channel, such that a predetermined minimum distance between change trajectory lines may be maintained. Also, the frequency estimator 160 may change the sampling frequency ($f_{s1}$) of the first channel and the sampling frequency ($f_{s2}$) of the second channel by further reflecting signal environments like noise, such that the minimum distance between change trajectory lines may be maintained.

$$\text{DISTANCE BETWEEN TRAJECTORIES} = \frac{|f_{s1} - f_{s2}|}{\sqrt{2}} \quad \text{[Equation 5]}$$

On the other hand, when the range of the input frequency is widened, the number of change trajectory lines may be increased, and thus the change trajectory lines may overlap. In this case, the ambiguity problem may be solved by increasing the sampling speed $f_s$, by expanding the space in which the trajectory may move or increasing the dimension of the space by using additional channels. In this case, although FIG. 6 shows that, when two channels are used, combinations of frequency values are arranged at different locations on a 2-dimensional plane. However, it is obvious that, when three channels are used, combinations of frequency values are arranged at different locations in a 3-dimensional space. In this case, as the space expands to the 3-dimensional space, the ambiguity problem may be resolved.

In this regard, when the frequencies of a signal are measured by using low-speed ADCs in N (two or more) channels, it is necessary to be able to calculate the frequency of the input signal by using the same.

On the other hand, as described above, because a sampling ambiguity occurring pattern is determined according to the sampling speed, when the sampling speed ($f_{s1}$, $f_{s2}$, ..., $f_{sN}$) is used in N channels, a measured frequency value vector ($f_{meas1}$, $f_{meas2}$, ..., $f_{measN}$) to be measured in the N channels according to changes of an input signal may be predicted. In other words, the frequency estimator 160 may predict a change in measured frequency values according to a change in an input signal, that is, a vector, based on an ambiguity pattern according to the sampling speed of each channel.

Therefore, when an external signal with an unknown frequency ($f_{in}$) is input during operation and a measured frequency value vector ($f_{meas1}$, $f_{meas2}$, ..., $f_{measN}$) is calculated from N channels, the frequency estimator 160 may output a frequency measurement result by using a pre-calculated prediction value. In this case, a signal frequency measurement result corresponding to the external signal may be output in real time.

For example, the frequency of a signal may be quickly found by using a measured frequency value vector ($f_{meas1}$, $f_{meas2}$, ..., $f_{measN}$) expected according to the frequency ($f_{in}$) of an input signal as an address of a semiconductor memory device (memory). In this case, when a frequency measurement result for each channel is calculated as k bit data, a memory device having an address space of kN bits may be used. In this case, the memory device may be a frequency combination database 162.

Moreover, although one or more embodiments have been described in detail, various modifications may be made therein without departing from the scope of one or more embodiments. In particular, although one or more embodiments have been described by exemplifying the configuration in which two channels are used and the frequency of an input signal is estimated based on combinations of frequencies measured in the respective channels on a 2-dimensional plane or three channels are used and the frequency of an input signal is estimated based on combinations of frequencies measured in the respective channels on a 3-dimensional plane, it is merely an embodiment, and one or more embodiments are not limited thereto. In other words, four or more channels may be freely used. In this case, input signal frequencies may be matched to combinations of more measured frequency values due to an increase in dimension, and thus the range of measurable input signal frequencies may be further extended as compared to the case of using three channels. In other words, by adding more channels with different sampling speeds, the range of the measurable input signal frequencies may be further extended.

According to at least one or more embodiments, a plurality of channels each including a low-speed ADC having a sub-Nyquist sampling rate (e.g. sampling frequency from several MHz to hundreds of MHz) are provided, and the frequency of an input signal corresponding to a combination of frequencies calculated through the respective channels is estimated. Therefore, as the number of channels increases, the range of measurable frequencies may be extended.

Also, according to at least one or more embodiments, the frequency of a broadband signal may be measured by using a plurality of inexpensive low-speed ADCs instead of an expensive high-speed ADC, thereby enabling measurement of the frequency of a broadband signal at a lower cost.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A frequency measuring apparatus comprising:
a coupler configured to generate an I component and a Q component from an input signal;
a distributor configured to distribute the I component and the Q component to a plurality of channels;
the plurality of channels each comprising an analog digital convertor (ADC), which is configured to sample an I component and a Q component input thereto and quantize a sampled I component and a sampled Q component, and a frequency measuring unit configured to calculate a frequency from a quantized I component and a quantized Q component; and
a frequency estimator configured to detect a signal frequency corresponding to a combination of frequency values respectively calculated in the plurality of channels based on frequency combination information including different signal frequencies and a combination of frequency values respectively corresponding to the signal frequencies,
wherein respective ADCs included in the plurality of channels have different sampling speeds for sampling the I component and the Q component,
wherein the frequency measuring unit
generates trajectories corresponding to frequency values calculated in the plurality of channels according to a change of an input signal in a multi-dimensional space according to the number of channels, and
when the trajectories overlap at least partially, changes a sampling frequency of each channel to satisfy a pre-set minimum distance between the trajectories.

2. The frequency measuring apparatus of claim 1, wherein the ADC has a sub-Nyquist sampling rate.

3. The frequency measuring apparatus of claim 2, wherein the ADC
further comprises a sampler configured to sample an I component and a Q component input thereto at a sub-Nyquist sampling rate.

4. The frequency measuring apparatus of claim 1, wherein the pre-set minimum distance is calculated according to Equation 5 below when the number of channels is 2, $$\text{DISTANCE BETWEEN TRAJECTORIES} = \frac{|f_{s1} - f_{s2}|}{\sqrt{2}} \quad \text{[Equation 5]}$$

where $f_{s1}$ represents a sampling frequency of a first channel, and $f_{s2}$ denotes a sampling frequency of a second channel.

5. A frequency measuring apparatus comprising:
a coupler configured to generate an I component and a Q component from an input signal;
a distributor configured to distribute the I component and the Q component to a plurality of channels;
the plurality of channels each comprising an analog digital convertor (ADC), which is configured to sample an I component and a Q component input thereto and quantize a sampled I component and a sampled Q component, and a frequency measuring unit configured to calculate a frequency from a quantized I component and a quantized Q component; and
a frequency estimator configured to detect a signal frequency corresponding to a combination of frequency values respectively calculated in the plurality of channels based on frequency combination information including different signal frequencies and a combination of frequency values respectively corresponding to the signal frequencies,
wherein respective ADCs included in the plurality of channels have different sampling speeds for sampling the I component and the Q component,
wherein the frequency measuring unit comprises:
a delay correlator configured to perform a correlation operation with values obtained by 1-clock delaying a quantized I component and a quantized Q component;
a cumulator configured to accumulate I component values and Q component values correlated by the delay correlator on an I and Q coordinate plane; and
a frequency calculator configured to calculate average values for each of accumulated I component values and accumulated Q component values that are accumulated on the I and Q coordinate plane, calculate a phase change range based on calculated average values of the accumulated I component values and the accumulated Q component values, and calculate a frequency value corresponding to a calculated phase change rate.

6. The frequency measuring apparatus of claim 1, wherein the frequency estimator comprises a memory having data corresponding to combinations of the frequency values as address values and having specific signal frequencies as data corresponding to the address values.

7. A frequency measuring method comprising:
a first step for generating an I component and a Q component from an input signal;
a second step for distributing the I component and the Q component to a plurality of channels;
a third step for sampling the I component and the Q component in each channel;
a fourth step for quantizing a sampled I component and a sampled Q component in each channel;
a fifth step for calculating a frequency value based on a quantized I component and a quantized Q component in each channel;
a sixth step for generating a combination of frequency values calculated in respective channels; and
a seventh step for estimating a signal frequency corresponding to generated combinations of frequency values based on frequency combination information including different signal frequencies and a combination of frequency values respectively corresponding to the signal frequencies,
wherein the third step is a step for sampling the I component and the Q component input to the respective channels at different sampling speeds from one channel to another,
wherein the seventh step comprises:
a step 7-1 for generating trajectories corresponding to frequency values calculated in the plurality of channels according to a change of an input signal in a multi-dimensional space according to the number of channels; and
a step 7-2 for, when the trajectories overlap at least partially, changing a sampling frequency of each channel to satisfy a pre-set minimum distance between the trajectories.

8. The method of claim 7, wherein the pre-set minimum distance is
calculated according to Equation 5 below when the number of channels is 2, $$\text{DISTANCE BETWEEN TRAJECTORIES} = \frac{|f_{s1} - f_{s2}|}{\sqrt{2}} \quad \text{[Equation 5]}$$

where $f_{s1}$ represents a sampling frequency of a first channel, and $f_{s2}$ denotes a sampling frequency of a second channel.

9. A frequency measuring method comprising:
a first step for generating an I component and a Q component from an input signal;
a second step for distributing the I component and the Q component to a plurality of channels;
a third step for sampling the I component and the Q component in each channel;
a fourth step for quantizing a sampled I component and a sampled Q component in each channel;
a fifth step for calculating a frequency value based on a quantized I component and a quantized Q component in each channel;
a sixth step for generating a combination of frequency values calculated in respective channels; and
a seventh step for estimating a signal frequency corresponding to generated combinations of frequency values based on frequency combination information including different signal frequencies and a combination of frequency values respectively corresponding to the signal frequencies,
wherein the third step is a step for sampling the I component and the Q component input to the respective channels at different sampling speeds from one channel to another,
wherein the fifth step includes a step for calculating a frequency value according to Equation 4 below, $$f_{avg_m}(n) = \frac{\Delta\phi_{avg_m}(n)}{2\pi\Delta t} = \frac{1}{2\pi t_s}\operatorname{atan}\left(\frac{Q'_{avg_m}(n)}{I'_{avg_m}(n)}\right) \quad \text{[Equation 4]}$$

$$= \frac{1}{2\pi t_s}\operatorname{atan}\left(\frac{\frac{\sum_{k=n-m+1}^{n} Q'(k)}{m}}{\frac{\sum_{k=n-m+1}^{n} I'(k)}{m}}\right)$$

where $f_{avg_m}(n)$ denotes a frequency value measured with the last m samples, $\Delta\phi_{avg_m}(n)$ denotes an average phase angle change rate of the last m samples, $\Delta t$ denotes a time for the last m samples, $t_s$ denotes 1/sampling frequency ($f_s$), $Q'_{avg_m}(n)$ denotes an average of Q component correlation values Q' of the last m samples, $I'_{avg_m}(n)$ denotes an average of I component correlation values I' of the last m samples, and m denotes the number of samples-used for averaging.

10. The method of claim 9, wherein the Q component correlation value Q' and the I component correlation value I' are values calculated by correlation-calculating an I component and a Q component, which are obtained by quantizing a sampled I component and a sampled Q component for each channel, according to Equation 3 below, $$I'(n) = (\cos(\phi(n))\cos(\phi(n-1)) + \sin(\phi(n))\sin(\phi(n-1)))$$

$$Q'(n) = (\sin(\phi(n))\cos(\phi(n-1)) - \cos(\phi(n))\sin(\phi(n-1))) \quad \text{[Equation 3]}$$

where Q' denotes the Q component correlation value, I' denotes the I component correlation value, and $\phi$ is a signal phase in radians.

* * * * *